United States Patent
Yoon et al.

(10) Patent No.: US 11,649,544 B2
(45) Date of Patent: May 16, 2023

(54) METHOD FOR DEPOSITING LARGE-AREA GRAPHENE LAYER AND APPARATUS FOR CONTINUOUS GRAPHENE DEPOSITION

(71) Applicant: KUK-IL GRAPHENE CO., LTD, Seongnam-si (KR)

(72) Inventors: Dong Ho Yoon, Seoul (KR); Chul Kyu Song, Seongnam-si (KR); Ji Hye Han, Gongju-si (KR); Soon Gil Yoon, Daejeon (KR); Ji Ho Eom, Daejeon (KR)

(73) Assignee: KUK-IL GRAPHENE CO., LTD, Seongnam-si (KR)

( * ) Notice: Subject to any disclaimer, the term of this patent is extended or adjusted under 35 U.S.C. 154(b) by 265 days.

(21) Appl. No.: 17/116,656

(22) Filed: Dec. 9, 2020

(65) Prior Publication Data

US 2021/0172059 A1     Jun. 10, 2021

(30) Foreign Application Priority Data

Dec. 10, 2019     (KR) .................. 10-2019-0163901

(51) Int. Cl.
  *C23C 16/26*     (2006.01)
  *C23C 14/14*     (2006.01)
  (Continued)

(52) U.S. Cl.
  CPC .............. *C23C 16/26* (2013.01); *C23C 14/14* (2013.01); *C23C 14/5846* (2013.01);
  (Continued)

(58) Field of Classification Search
  CPC ..... C23C 16/26; C23C 16/4408; C23C 16/50; C23C 16/0281; C23C 16/545; C23C 16/4401; C23C 14/14; C23C 14/5846; C23C 14/568; C23C 14/5826; C23C 14/5873; C23C 28/322; C23C 28/34; H01J 37/34; H01J 37/32761; H01J 37/32834; H01J 37/3277; H01J 37/32816; H01L 21/67173

(Continued)

(56) References Cited

FOREIGN PATENT DOCUMENTS

KR    10-2015-0071724 A    6/2015
KR    10-2016-0141350 A    12/2016
(Continued)

OTHER PUBLICATIONS

Office Action in Korean Application No. 10-2019-0163901 dated Jul. 28, 2021 and its English Summary in 6 pages.

*Primary Examiner* — Rodney G McDonald
(74) *Attorney, Agent, or Firm* — Knobbe, Martens, Olson & Bear, LLP (57) ABSTRACT

A method for depositing a large-area graphene layer and an apparatus for continuous graphene deposition using the same are disclosed. The method can include forming a titanium (Ti) layer on a substrate by sputtering, reducing the titanium layer by spraying a reductant gas containing a hydrogen gas ($H_2$) and a purge gas onto the titanium layer while moving in a first direction in relation to the substrate and exhausting the reductant gas and the purge gas. The method can also include forming graphene by spraying a reactant gas containing a graphene source and the purge gas onto the titanium layer while moving in a second direction opposite the first direction in relation to the substrate and exhausting the reactant gas and the purge gas.

10 Claims, 5 Drawing Sheets

(51) Int. Cl.
    *C23C 14/58*     (2006.01)
    *C23C 28/00*     (2006.01)
    *C23C 16/50*     (2006.01)
    *C23C 16/44*     (2006.01)

(52) U.S. Cl.
    CPC .......... *C23C 16/4408* (2013.01); *C23C 16/50* (2013.01); *C23C 28/322* (2013.01); *C23C 28/34* (2013.01)

(58) Field of Classification Search
    USPC ........ 204/192.15, 298.24; 118/718; 427/446, 427/450
    See application file for complete search history.

(56) References Cited

FOREIGN PATENT DOCUMENTS

| | | |
|---|---|---|
| KR | 10-2017-0035323 A | 3/2017 |
| KR | 10-2019-0046534 A | 5/2019 |

METHOD FOR DEPOSITING LARGE-AREA GRAPHENE LAYER AND APPARATUS FOR CONTINUOUS GRAPHENE DEPOSITION

CROSS-REFERENCE TO RELATED APPLICATIONS

This application claims the benefit of Korean Patent Application No. 10-2019-0163901, filed with the Korean Intellectual Property Office on Dec. 10, 2019, the disclosure of which is incorporated herein by reference in its entirety.

BACKGROUND

Technical Field

The present disclosure relates to a method for depositing a large-area graphene layer and an apparatus for continuous graphene deposition using the same. More particularly, the present disclosure relates to a method for depositing a large-area graphene layer and an apparatus for continuous graphene deposition using the same that can allow transfer-free growth of a large-area graphene thin film in a low temperature of below 300° C.

Description of the Related Technology

Graphene is a 2-dimensional hexagonal $sp^2$ allotrope of carbon atoms and has a physical strength 200 times that of steel. Various interesting physical and electrical properties of graphene have been reported, such as a thermal conductivity about ten times that of metals such as copper or aluminum, a resistance lower by 35% or more than copper at normal temperature due to a very speedy electron mobility, and the anomalous Hall effect exhibited at normal temperature or higher. Because of such properties, recent times have seen active research in high-quality graphene manufacture and component applications.

Graphene can be manufactured by one of four types of methods, namely mechanical exfoliation methods, chemical manufacture methods using reductants, epitaxial methods using silicon carbide dielectrics, and chemical vapor deposition (CVD). With chemical vapor deposition in particular, it is possible to adjust the number of layers of the graphene by adjusting the type and thickness of the catalyst, the reaction time, the concentration of reactant gases, etc. Chemical vapor deposition also provides the most desirable properties in the manufactured graphene and allows mass production.

SUMMARY

An aspect of the present disclosure is to provide a method for depositing a large-area graphene layer and an apparatus for continuous graphene deposition using the same that can form a high-quality graphene layer with a large area at a low temperature (below 300° C.) with the transferring process omitted.

One aspect of the present disclosure provides a method for depositing a graphene layer that includes: forming a titanium (Ti) layer on a substrate by sputtering; reducing the titanium layer by spraying a reductant gas containing a hydrogen gas ($H_2$) and a purge gas onto the titanium layer while moving in a first direction in relation to the substrate and exhausting the reductant gas and the purge gas; and forming graphene by spraying a reactant gas containing a graphene source and the purge gas onto the titanium layer while moving in a second direction opposite the first direction in relation to the substrate and exhausting the reactant gas and the purge gas.

Another aspect of the present disclosure provides an apparatus for graphene deposition that includes a sputtering unit and an injector, where the sputtering unit is configured to form a titanium layer by depositing the titanium layer onto a surface of a substrate, the injector is configured to grow graphene on the titanium layer. The injector includes: a reductant supply unit configured to supply a reductant gas containing a hydrogen gas ($H_2$) to the substrate; a reactant supply unit configured to supply a reactant gas containing a graphene source to the substrate; a purge supply unit arranged between the reductant supply unit and the reactant supply unit and configured to supply a purge gas to the substrate; and an exhaust unit configured to exhaust gases from the substrate, where the reductant gas of the reductant supply unit and the purge gas of the purge supply unit are sprayed onto the titanium layer as the injector moves in a first direction in relation to the substrate, and the reactant gas of the reactant supply unit and the purge gas of the purge supply unit are sprayed onto the titanium layer as the injector moves in a second direction opposite the first direction in relation to the substrate.

An embodiment of the present disclosure can prevent the intermixing of the reductant gas and the reactant gas, through both a sequential separation between the reduction of the titanium layer and the growth of the graphene and a spatial separation between the zones for supplying the reductant gas and the reactant gas by way of a purge gas, and as this can prevent the occurrence of particles that would otherwise be created as a result of mixing between the reductant and reactant gases, it is possible to manufacture graphene of a high quality.

DETAILED DESCRIPTION

Forming a graphene thin film with a chemical vapor deposition method may require a transferring process and is limited in application in that the deposition must be performed at a high temperature. During a transferring process, mechanical deformities (wrinkles, ripples, etc.) in the graphene as well as the residual etchant of the catalyst metal, etc., can cause many defects in the interface between the transferred graphene layer and the base substrate, and such defects in turn may degrade the behavioral properties of a component using the graphene/substrate structure. The residue of the support layer formed for the transferal may also cause decreases in the conductivity and transparence of the graphene and increases in the surface roughness. Korean Patent Application No. 10-2016-0105001 (published as 10-2017-0035323) provides a method of forming a graphene thin film using a titanium (Ti) catalyst layer that does not require a transferring process. For practical application, however, this method still requires a method for growing a graphene thin film over a large area.

Terms used in the present application are used merely for describing particular embodiments and are not intended to limit the present disclosure in any way. An expression used in the singular encompasses the expression of the plural, unless it has a clearly different meaning in the context.

In the present application, mention of a part "including" an element does not preclude the existence of other elements but rather retains the possibility of one or more other elements being present, unless there is specific mention to the contrary. Also, throughout the specification, the term "on" is intended to mean that a component can be positioned at an upper portion or a lower portion of the mentioned part and does not necessarily refer to an upper position with respect to the direction of gravity.

Also, reference to bonding or binding, in the context of contact between two elements, is used not only to represent cases in which the elements are in direct physical contact but also encompasses cases in which another element is placed between the two elements with the two elements placed in contact with the other element.

While such terms as "first" and "second", etc., can be used to describe various elements, such elements are not to be limited by the above terms. These terms are used only to distinguish one element from another.

As the sizes and thickness of the elements illustrated in the drawings were chosen arbitrarily with the focus on convenience of the illustration, the present disclosure is not to be limited by the illustrated drawings.

Certain embodiments of a method for depositing a large-area graphene layer and an apparatus for continuous graphene deposition based on the present disclosure are described below in further detail with reference to the accompanying drawings. In describing the present disclosure with reference to the accompanying drawings, the same or corresponding elements are assigned the same reference numerals, and redundant descriptions are omitted.

Figure 1:
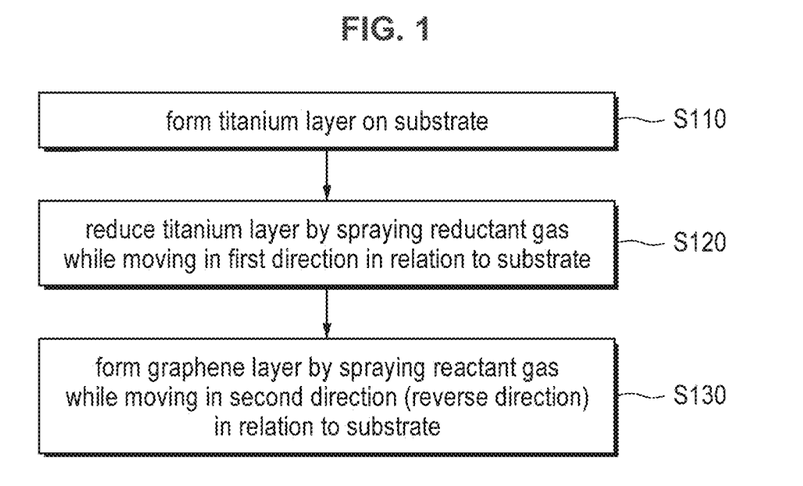
FIG. 1 is a flow diagram illustrating a method for depositing a large-area graphene layer according to an embodiment of the present disclosure.
Figure 2:
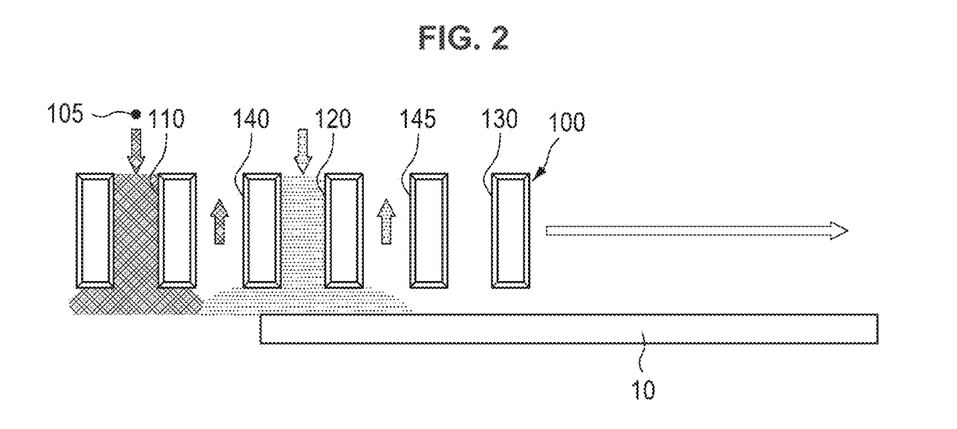
FIG. 2 and FIG. 3 illustrate a method for depositing a large-area graphene layer according to an embodiment of the present disclosure.
Figure 3:
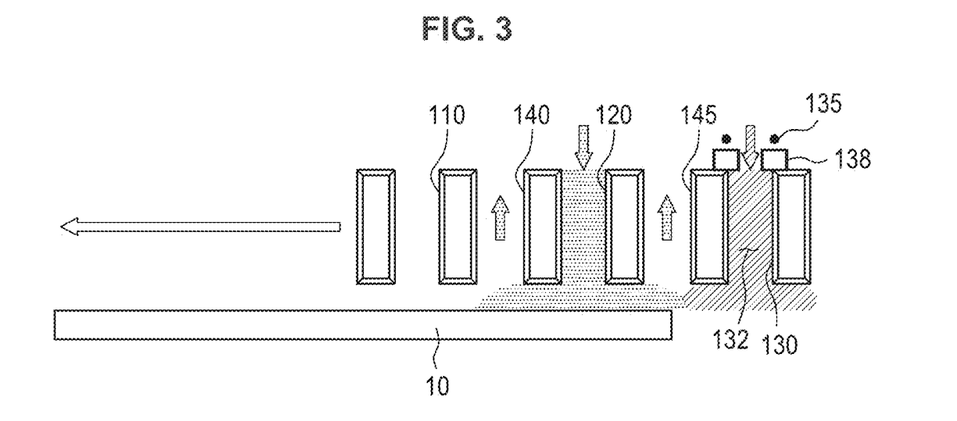

FIG. 1 is a flow diagram illustrating a method for depositing a large-area graphene layer according to an embodiment of the present disclosure, and FIGS. 2 and 3 illustrate a method for depositing a large-area graphene layer according to an embodiment of the present disclosure.

Referring to FIG. 1, a method for depositing a large-area graphene layer according to an embodiment of the present disclosure may include forming a titanium (Ti) layer (operation S110), reducing the titanium layer (operation S120), and forming the graphene (operation S130).

In the operation of forming the titanium layer (operation S110), a titanium layer may be formed on a substrate 10. In this embodiment, the titanium layer can be formed on the substrate 10 by way of sputtering.

For example, after the substrate 10 is cleansed and impurities are removed from the surface of the substrate 10 using nitrogen gas ($N_2$), a titanium layer can be deposited on the substrate 10 with a DC sputtering method using a titanium (Ti) metal target of 99.99% purity.

It is possible to perform the sputtering using FTS (face target sputtering), on-axis sputtering, etc., and it is also possible to have multiple sputtering modules form the titanium layer at once.

Here, before the titanium layer is formed, the atmosphere of the chamber in which the titanium is to be deposited can be prepared with an inert gas (Ar, $N_2$), and the outer walls of the chamber can be maintained at a particular temperature condition (e.g. at about 100° C. or lower for about ten minutes), to thereby sufficiently remove oxygen and moisture from within the chamber.

In the operation of reducing the titanium layer (operation S120), the titanium layer may be reduced by spraying a reductant gas onto the substrate 10 while moving in a first direction in relation to the substrate 10. Here, a plasma can be formed from the gas, and this can be applied together onto the titanium layer.

In this embodiment, a reductant gas containing hydrogen gas ($H_2$) and hydrogen plasma can be sprayed onto the titanium layer. Also, a purge gas containing nitrogen gas ($N_2$) or argon gas (Ar) can be sprayed together with the reductant gas. The reductant gas can be applied to the titanium layer of the substrate 10 to reduce the titanium layer and afterwards can be exhausted together with the purge gas.

For example, in order to remove the oxide layer from the surface of the titanium layer formed on the substrate 10, the temperature and pressure can be maintained at levels suitable for a reduction reaction while the hydrogen gas is flowed as a reductant gas. Accordingly, the titanium oxide can be easily reduced by the treatment under the hydrogen plasma or hydrogen gas atmosphere.

Also, an inert gas such as nitrogen gas ($N_2$) or argon gas (Ar) can be sprayed onto the titanium layer of the substrate 10. An inert atmosphere can thus be prepared at the surface of the titanium layer with nitrogen gas ($N_2$) or argon gas (Ar).

An apparatus for graphene deposition, for executing a method for depositing a graphene layer according to an embodiment of the present disclosure, can include an injector 100. Here, the injector 100 can be the part that grows the graphene on the titanium layer and can include a reductant supply unit 110, a reactant supply unit 130, a purge supply unit 120, and exhaust units 140, 145.

The reductant supply unit 110 may supply the substrate 10 with a reductant gas containing hydrogen gas ($H_2$). Here, it is possible to form a plasma from the hydrogen gas and supply the plasma together to the titanium layer.

Referring to FIG. 2, an electrode rod 115 can be installed on the reductant supply unit 110. Plasma power can be applied to the electrode rod 115, and when plasma power is applied, hydrogen gas passing by in the vicinity of the electrode rod 115 can be changed to a hydrogen plasma state.

Also, the purge supply unit 120 can be arranged between the reductant supply unit 110 and the reactant supply unit 130 to supply the substrate 10 with a purge gas.

Referring to FIG. 2, the reductant supply unit 110, the purge supply unit 120, and the reactant supply unit 130 can be formed in order in a row at the portion of the injector 100 facing the substrate 10, and the injector 100 can supply the purge gas and the reductant gas to the titanium layer of the substrate 10 while moving in a first direction in relation to the substrate 10. The substrate 10 can sequentially pass through the zone where the purge gas is supplied and the zone where the reductant gas is supplied, and the titanium layer of the substrate 10 can sequentially contact the purge gas and the reductant gas.

An exhaust unit 140, 145 may a part that exhausts gases from the substrate 10. In this embodiment, the exhaust units 140, 145 can include a first exhaust unit 140 that is formed between the reductant supply unit 110 and the purge supply unit 120 and a second exhaust unit 145 that is formed between the purge supply unit 120 and the reactant supply unit 130.

Thus, as the injector 100 moves in the first direction in relation to the substrate 10, the first exhaust unit 140 can exhaust the reductant gas and the purge gas, and the second exhaust unit 145 can exhaust the purge gas.

In the operation of growing the graphene (operation S130), the graphene may be grown by spraying a reactant gas onto the substrate 10 while moving in a second direction, which may be the opposite direction of the first direction, in relation to the substrate 10.

In this embodiment, a reactant gas containing methane gas ($CH_4$) can be sprayed onto the titanium layer. Also, a purge gas containing hydrogen ($H_2$), nitrogen gas ($N_2$) or argon gas (Ar) can be sprayed together with the reactant gas. The reactant gas can be applied to the titanium layer of the substrate 10 to form a graphene layer and afterwards can be exhausted together with the purge gas.

The temperature can be raised to be conducive to decomposing the methane gas and forming a plasma state, and afterwards, a graphene source obtained as a result of the decomposition of the methane gas can be sprayed onto the titanium layer, whereby graphene can be grown on the titanium layer.

Referring to FIG. 3, an electrode rod 135 can be installed on the reactant supply unit 130. The electrode rod 135 can decompose the methane gas to generate the graphene source. Plasma power can be applied to the electrode rod 135, and when plasma power is applied, methane gas passing by in the vicinity of the electrode rod 135 can be decomposed to a plasma state. When the methane gas is decomposed, the carbon of the methane gas can be separated to atom states and be used as the graphene source.

Here, to minimize damage to the graphene by the plasma generated from the methane gas, a design can be adopted that enables an indirect deposition within the injector 100.

Referring to FIG. 3, an electrode rod cover 138 can cover a portion of the electrode rod 135 on the side of the substrate 10. That is, the electrode rod cover 138 can cover the electrode rod 135 such that the electrode rod 135 is not directly exposed to the nozzle 132 through which the reactant gas is sprayed. Thus, the plasma generated around the electrode rod 135 can be suppressed from contacting the graphene layered on the substrate 10.

Also, an inert gas such as nitrogen gas ($N_2$) or argon gas (Ar), etc., can be sprayed onto the titanium layer of the substrate 10 to remove the reductant gas physically adhered to the surface of the titanium layer and thus prevent the reductant gas and the reactant gas from mixing with each other.

In a graphene deposition apparatus 1000 according to an embodiment of the present disclosure, the reactant supply unit 130 may supply a reactant gas containing methane gas ($CH_4$) onto the substrate 10.

Referring to FIG. 3, the reductant supply unit 110, the purge supply unit 120, and the reactant supply unit 130 can be formed in order in a row in the injector 100, and the injector 100 can supply the purge gas and the reactant gas to the titanium layer of the substrate 10 while moving in a second direction (the opposite direction of the first direction) in relation to the substrate 10.

The substrate 10 can sequentially pass through the zone where the purge gas is supplied and the zone where the reactant gas is supplied, and the titanium layer of the substrate 10 can sequentially contact the purge gas and the reactant gas. After the reductant gas that was physically adhered to the surface of the titanium layer is thus removed by the purge gas, the reactant gas can form the graphene over the titanium layer. That is, the purge gas can be used to spatially divide the reductant gas and the reactant gas, so that the reductant gas is prevented from being mixed with the reactant gas. Here, as the injector 100 moves in the second direction in relation to the substrate 10, the second exhaust unit 145 can exhaust the reactant gas and the purge gas, and the first exhaust unit 140 can exhaust the purge gas.

Thus, to prevent mixing between the reductant gas and the reactant gas, an embodiment of the present disclosure can provide sequential separation between the operation for reducing the titanium layer and the operation for growing the graphene and at the same time can provide spatial separation between the zones for supplying the reductant gas and the reactant gas using a purge gas, thereby preventing the occurrence of particles that would otherwise be created as a result of mixing between the reductant and reactant gases.

Also, an embodiment of the present disclosure can grow graphene on a substrate 10 repeatedly as the injector 100 undergoes an oscillating movement with respect to the substrate 10, thus making it possible to form the graphene over a large area.

The operation of reducing the titanium layer can be performed with just a one-time movement in the first direction in relation to the substrate 10. That is, it is possible to remove the oxide film of the titanium layer by having the reductant supply unit 110 transform the hydrogen gas into a plasma state only at the initial one-time movement.

Also, the operation of forming the graphene can repeat a procedure of growing the graphene over the titanium layer while moving in the second direction in relation to the substrate 10 and a procedure of spraying an inert gas onto the titanium layer while moving in the first direction in relation to the substrate 10. That is, after the oxide film of the titanium layer has been removed with the hydrogen plasma, the reductant supply unit 110 no longer needs to apply the hydrogen plasma and can spray the inert gas to prevent the titanium layer from being oxidized.

In other words, when the injector 100 performs the oscillating movement by repeatedly moving in the first direction and second direction in relation to the substrate 10, the reductant supply unit 110 may apply the hydrogen plasma and reduce the titanium layer during only the initial one-time movement from among the repeated movements in the first direction.

Then, after the titanium layer is reduced, an inert gas can be sprayed as the injector 100 moves in the first direction in relation to the substrate 10. That is, after the titanium layer is reduced, the procedure in which the reactant supply unit 130 sprays the graphene source decomposed from the methane gas onto the titanium layer while moving in the second direction in relation to the substrate and the procedure in which the reductant supply unit 110 sprays the inert gas onto the titanium layer while moving in the first direction in relation to the substrate can be performed repeatedly to grow the graphene layer.

Figure 4:
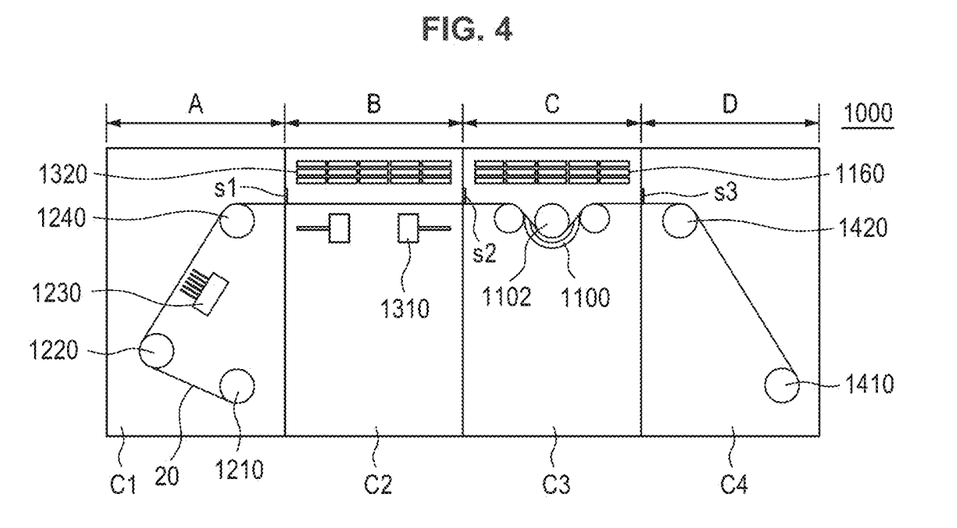
FIG. 4, FIG. 5, and FIG. 6 illustrate an apparatus for continuous graphene deposition according to an embodiment of the present disclosure.
Figure 5:
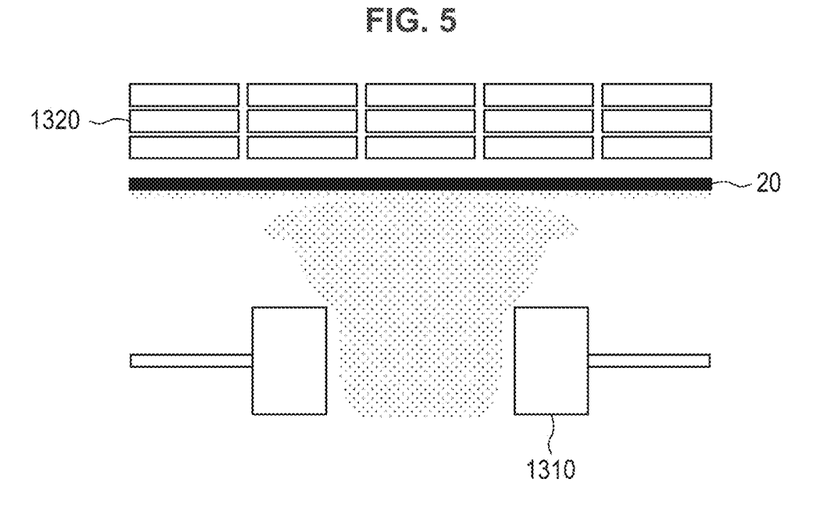
Figure 6:
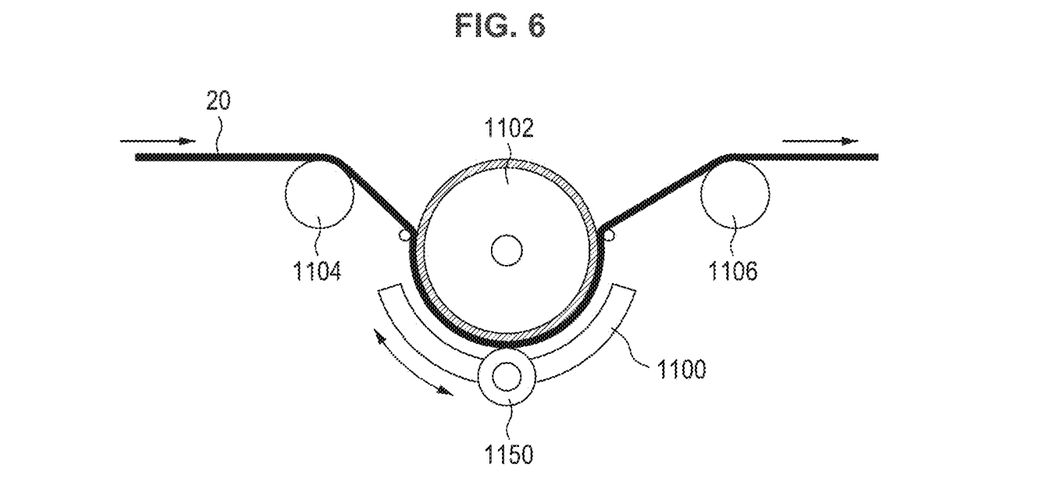

FIGS. 4 to 6 illustrate an apparatus for continuous graphene deposition according to an embodiment of the present disclosure. FIG. 5 provides a more detailed illustration of the sputtering unit 1310 in a graphene continuous deposition apparatus 1000 based on this embodiment, while FIG. 6 provides a more detailed illustration of the injector 1100 in a graphene continuous deposition apparatus 1000 based on this embodiment.

Referring to FIG. 4, a graphene continuous deposition apparatus 1000 according to an embodiment of the present disclosure may include a sputtering unit 1310.

The sputtering unit 1310 may form a titanium layer by depositing the titanium layer on a surface of a substrate 10.

Referring to FIG. 5, the sputtering unit 1310 can include a DC sputtering device that uses a titanium (Ti) metal target. It is possible to perform the sputtering using FTS (face target sputtering), on-axis sputtering, etc., and it is also possible to have multiple sputtering modules form the titanium layer at once.

Also, the sputtering unit 1310 can include a first substrate temperature adjuster 1320 for heating the substrate 10, so as to be capable of adjusting the temperature of the substrate 10 on which the titanium layer is to be deposited.

A substrate 10 used for a graphene continuous deposition apparatus 1000 according to this embodiment can include a film 20. Also, the graphene continuous deposition apparatus 1000 can further include a film transport unit that is equipped with multiple rollers 1210, 1220, 1240, 1102, 1104, 1106, 1410, 1420 for supplying and retrieving the film 20 to and from the sputtering unit 1310 and the injector 1100.

Referring to FIG. 4, a graphene continuous deposition apparatus 1000 according to this embodiment can form graphene continuously on the film 20 serving as the substrate 10 by way of roll-to-roll processing. The roll-to-roll processing can be divided into a film supply process A, a titanium deposition process B, a graphene deposition process C, and a film retrieval process D.

Here, each process A~D can be performed separately in an independent chamber C1~C4. Since the optimal environmental conditions for performing the process may differ for each process, each process can be performed in an independent chamber C1~C4, so that the environmental conditions may be controlled for each process. In addition, the chambers C1~C4 can serve to block any movement of impurities between processes, in order that a substance formed in one process does not act as an impurity in another process.

In the roll-to-roll processing, as the film 20 is to pass through each process continuously, the chambers C1~C4 can have slits formed through which the film 20 may pass.

Referring to FIG. 4, walls for partitioning the chambers C1~C4 can be installed between neighboring C1~C4, and slits can be formed in the walls, so that the film 20 may pass through the slits and move continuously across several chambers C1~C4.

Here, shutters s1~s3 for adjusting the widths of the slits can be installed on the chambers. For example, when the film 20 is being transported, a shutter s1~s3 can position the gate, which serves as a door, to be about 1~5 mm higher than the film thickness (i.e. making the width of the slit 1~5 mm greater than the film thickness) to facilitate the movement of the film 20. Also, when the film 20 is made stationary to undergo a process, the shutter s1~s3 can close the gate as much as possible (i.e. to minimize the width of the slit), so that the environmental conditions may be controlled according to each chamber C1~C4.

In the film supply process A, a protective film can be removed from the film 20, and any impurities on the film 20 can be removed. The film transport unit of the graphene deposition apparatus 1000 can include a film supply roller 1220 and a protective film retrieval roller 1210. The graphene deposition apparatus 1000 can further include a film preprocessing device 1230 that removes impurities from the surface of the film 20 by applying a plasma on the transported film 20. Also, in order to keep the tension applied on the film 20 at an adequate amount, the film transport unit can further include a tension adjustment roller 1240.

In the titanium deposition process B, the sputtering unit 1310 described above may deposit a titanium layer on the film transported by the film transport unit.

In the graphene deposition process C, graphene may be formed on the film 20 on which the titanium layer has been formed.

Referring to FIG. 4 and FIG. 6, the injector 1100 can be arranged to face the surface of the film 20 on which the titanium layer is formed, and the injector 1100 can form graphene over the titanium layer while oscillating along the progressing direction of the film 20 as described above. Here, the first direction in which the injector 1100 moves with respect to the film 20 can be the transport direction of the film 20, and the second direction can be the opposite direction of the transport direction. Also, since the movement of the injector 1100 in relation to the film 20 refers to a relative movement, it is possible to have the injector 1100 stationary at a fixed position and have the film 20 undergo an oscillating movement in the first direction and second direction in relation to the injector 1100.

Here, the film transport unit can include a support roller 1102, which may be arranged across from the injector 1100 and may support the film 20 such that the surface of the film 20 on which the titanium layer is formed is arranged facing the injector 1100.

Referring to FIG. 6, the injector 1100 can form graphene over the film 20 placed on the support roller 1102.

Here, the injector 1100 can be equipped with an inner curved surface formed to maintain a particular distance from the surface of the film 20 supported on the support roller 1102. Also, the reductant gas, reactant gas, and purge gas can be supplied to the inner curved surface. That is, since the film 20 supported on the support roller 1102 may form an arc shape, the part of the injector 1100 supplying the gases can also be shaped as a concentric arc in a corresponding manner. The injector 1100 can undergo an oscillating movement along the circumferential direction of the support roller 1102. The graphene continuous deposition apparatus 1000 can further include an injector rotation device 1150 that rotates the injector 1100 along the circumferential direction. Also, in order that an adequate amount of tension may be maintained on the film 20, the film transport unit can further include tension adjustment rollers 1104, 1106.

Thus, even when the film 20 serving as the substrate 10 is supported on a curved surface for the roll-to-roll processing, the distance between the film 20 and the injector 1100 can be kept uniform, and the graphene can be formed with a uniform quality.

While this embodiment is described as having an injector 1100 that undergoes an oscillating movement along a circumferential direction in correspondence with the support roller 1102, the shape and operation of the injector are not limited to this embodiment.

Figure 7:
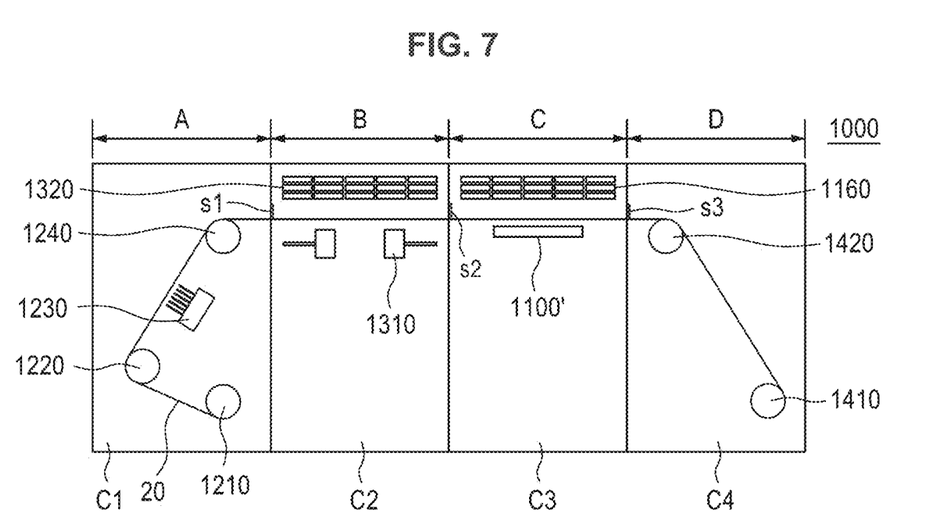
FIG. 7 illustrates an apparatus for continuous graphene deposition according to another embodiment of the present disclosure.

FIG. 7 illustrates an apparatus for continuous graphene deposition according to another embodiment of the present disclosure.

Referring to FIG. 7, even when the film 20 is transported in a planar form, the graphene deposition can be achieved with an injector 1100'. Here, the injector 1100' can have a flat structure in correspondence with the planar form of the film 20 and can perform the oscillating movement linearly along the lengthwise direction of the film 20.

Also, in order to adjust the temperature of the film 20 onto which the graphene is deposited in the graphene deposition process C, a second substrate temperature adjuster 1160 for heating the film 20 can be additionally included.

In the film retrieval process D, the film 20 on which the graphene has been deposited can be wound up as a roll for retrieval, and the film transport unit of the graphene deposition apparatus 1000 can include a film retrieval roller 1410 and a tension adjustment roller 1420.

Figure 8:
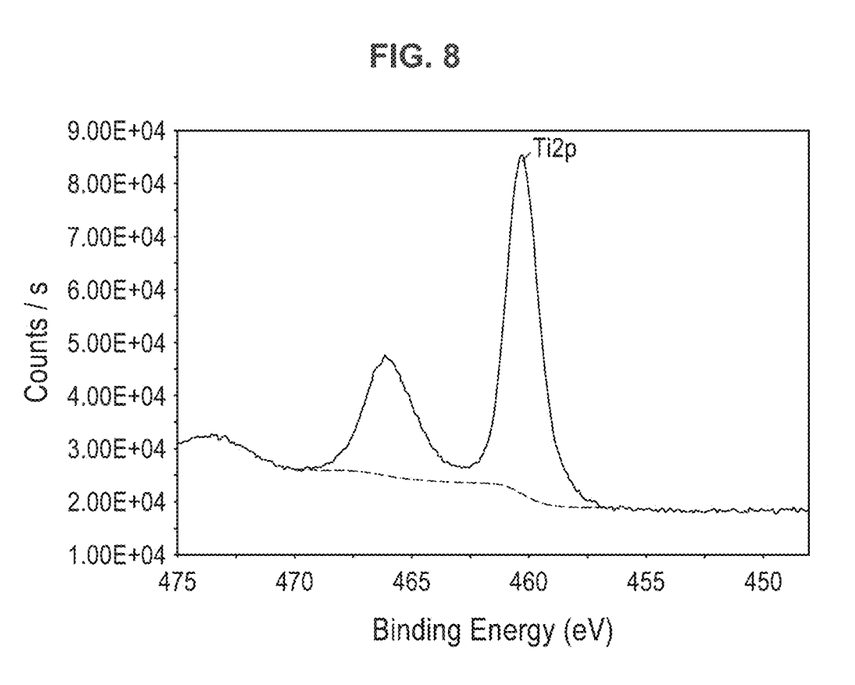
FIG. 8 is a graph representing the binding energy between Ti—Ti bonds obtained as a result of XPS analysis on a titanium layer according to an embodiment of the present disclosure.
Figure 9:
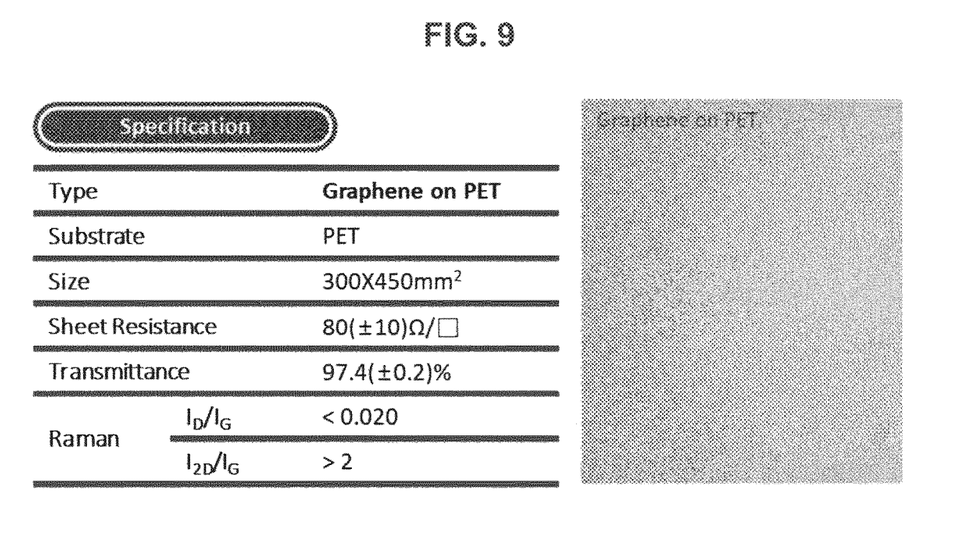
FIG. 9 shows an image of a large-area graphene thin film deposited on a PET film according to an embodiment of the present disclosure, together with the properties of the thin film.

FIG. 8 is a graph representing the binding energy between Ti—Ti bonds obtained as a result of XPS analysis on a titanium layer according to an embodiment of the present disclosure, and FIG. 9 shows an image of a large-area graphene thin film deposited on a PET film according to an embodiment of the present disclosure, together with the properties of the thin film.

Referring to FIG. 8, it can be seen that, in a roll-to-roll processing setup according to an embodiment of the present disclosure, the sputtering unit 1310 is able to form a titanium layer having a high Ti—Ti bonding strength on the PET film.

Also, referring to FIG. 9, it can be seen that the graphene was deposited over a large area on the PET film with the roll-to-roll processing and that the deposited graphene has a uniform quality.

More specifically, FIG. 9 shows a table listing the thin film properties of a PET film of 450 mm$^2$ width on which graphene was deposited according to an embodiment of the present disclosure. The sheet resistance of the thin film is shown as 80Ω/□, and the transmittance of the thin film is shown as about 97%. Micro Raman analysis results show a D peak/G peak intensity ratio of 0.02 or lower and a 2D peak/G peak intensity ratio of 2 or higher.

While the foregoing describes certain embodiments of the present disclosure, the person having ordinary skill in the art would understand that the present disclosure can be modified and altered in various ways without departing from the spirit of the present disclosure disclosed in the claims by supplementing, altering, omitting, or adding one or more elements, and it should be noted that such modifications and alterations are encompassed within the scope of rights of the present disclosure.

What is claimed is:

1. A method for depositing a graphene layer, the method comprising:
    forming a titanium (Ti) layer on a substrate by sputtering;
    reducing the titanium layer by spraying a reductant gas and a purge gas onto the titanium layer while moving in a first direction in relation to the substrate and exhausting the reductant gas and the purge gas, the reductant gas containing a hydrogen gas ($H_2$); and
    forming graphene by spraying a reactant gas and the purge gas onto the titanium layer while moving in a second direction opposite to the first direction and exhausting the reactant gas and the purge gas, the reactant gas containing a graphene source.

2. The method of claim 1, wherein the titanium layer is reduced by generating a hydrogen plasma from the hydrogen gas and applying the hydrogen plasma,
    and wherein the forming of the graphene comprises growing the graphene on the titanium layer by spraying the graphene source decomposed from a methane gas ($CH_4$).

3. The method of claim 2, wherein the titanium layer is reduced while moving once in the first direction,
    and wherein the forming of the graphene comprises repeating:
        growing graphene on the titanium layer while moving in the second direction; and
        spraying an inert gas onto the titanium layer while moving in the first direction.

4. An apparatus for continuous graphene deposition, the apparatus comprising:
    a sputtering unit and an injector, the sputtering unit configured to form a titanium layer by depositing the titanium layer onto a surface of a substrate, the injector configured to grow graphene on the titanium layer,
    wherein the injector comprises:
        a reductant supply unit configured to supply a reductant gas to the substrate, the reductant gas containing a hydrogen gas ($H_2$);
        a reactant supply unit configured to supply a reactant gas to the substrate, the reactant gas containing a graphene source;
        a purge supply unit arranged between the reductant supply unit and the reactant supply unit, the purge supply unit configured to supply a purge gas to the substrate; and
        an exhaust unit configured to exhaust gases from the substrate,
    wherein the injector is configured to spray the reductant gas and the purge gas onto the titanium layer while moving in a first direction in relation to the substrate, and
    wherein the injector is configured to spray the reactant gas and the purge gas onto the titanium layer while moving in a second direction opposite to the first direction.

5. The apparatus of claim 4, wherein the reductant supply unit is configured to generate a hydrogen plasma from the hydrogen gas and apply the hydrogen plasma,
    and wherein the reactant supply unit is configured to spray a graphene source decomposed from a methane gas ($CH_4$).

6. The apparatus of claim 5, wherein the injector is configured to move repeatedly in the first direction and the second direction in relation to the substrate in an oscillating movement,
    wherein, the reductant supply unit is configured to perform reduction by applying the hydrogen plasma onto the titanium layer during an initial movement in the first direction in relation to the substrate,
    wherein the injector is configured to repeatedly spray the graphene source and an inert gas,
    wherein the injector is configured to spray the graphene source as the reactant supply unit sprays the graphene source onto the titanium layer while moving in the second direction in relation to the substrate, and
    wherein the injector is configured to spray the inert gas as the reductant supply unit sprays the inert gas onto the titanium layer while moving in the first direction in relation to the substrate.

7. The apparatus of claim 5, wherein the reactant supply unit further comprises:
    an electrode rod configured to apply plasma power to decompose the methane gas and generate the graphene source; and
    an electrode rod cover covering the electrode rod and configured to suppress an exposure of plasma to the substrate.

8. The apparatus of claim 4, wherein the substrate comprises a film, wherein the apparatus further comprises a film transport unit equipped with a plurality of rollers, the film transport unit configured to supply and retrieve the film to and from the sputtering unit and the injector, and wherein the apparatus is configured to form graphene continuously on the film by roll-to-roll processing.

9. The apparatus of claim 8, wherein the film transport unit comprises a support roller arranged facing the injector, the support roller configured to support the film such that a surface of the film having the titanium layer formed thereon faces the injector, wherein the injector has an inner curved surface formed to maintain a constant distance to the surface of the film supported by the support roller and is configured to supply the reductant gas, the reactant gas, and the purge gas to the inner curved surface, and wherein the injector is configured to perform an oscillating movement following a circumferential direction of the support roller.

10. The apparatus of claim 8, wherein the roll-to-roll processing comprises a film supply process, a titanium deposition process, a graphene deposition process, and a film retrieval process, wherein each process is performed separately in an independent chamber, and wherein the chamber has a slit formed therein to allow a passage of the film and has a shutter installed thereon to adjust a width of the slit.

\* \* \* \* \*